(12) United States Patent
Warmoth et al.

(10) Patent No.: US 9,038,973 B2
(45) Date of Patent: May 26, 2015

(54) ACCESSORY BRACKET

(75) Inventors: Thomas B. Warmoth, Downers Grove, IL (US); Jonathan D. Walker, Chicago, IL (US); Brendan F. Doorhy, Westmont, IL (US)

(73) Assignee: Panduit Corp., Tinley Park, IL (US)

( * ) Notice: Subject to any disclaimer, the term of this patent is extended or adjusted under 35 U.S.C. 154(b) by 2068 days.

(21) Appl. No.: 12/169,249

(22) Filed: Jul. 8, 2008

(65) Prior Publication Data
US 2009/0014614 A1 Jan. 15, 2009

Related U.S. Application Data

(60) Provisional application No. 60/970,293, filed on Sep. 6, 2007, provisional application No. 60/949,413, filed on Jul. 12, 2007.

(51) Int. Cl.
*A47B 96/06* (2006.01)
*H05K 7/14* (2006.01)

(52) U.S. Cl.
CPC .................................... *H05K 7/1489* (2013.01)

(58) Field of Classification Search
USPC .................. 248/176.1, 218.4, 309.1; 211/26; 174/101; 385/135; 439/540.1
See application file for complete search history.

(56) References Cited

U.S. PATENT DOCUMENTS

| | | | |
|---|---|---|---|
| 4,497,411 A | 2/1985 | DeBortoli | |
| 4,712,232 A | 12/1987 | Rodgers | |
| 5,078,613 A * | 1/1992 | Salmon | ........................... 439/92 |
| 5,115,377 A | 5/1992 | Dransman | |
| 5,277,393 A * | 1/1994 | Nicholson et al. | ............ 248/243 |
| 5,548,489 A | 8/1996 | Reed et al. | |
| 5,647,763 A * | 7/1997 | Arnold et al. | ............... 439/540.1 |
| 5,885,112 A * | 3/1999 | Louwagie et al. | ............ 439/719 |
| 5,975,962 A | 11/1999 | Laukonis | |
| 6,102,214 A | 8/2000 | Mendoza | |
| 6,307,997 B1 * | 10/2001 | Walters et al. | ................. 385/134 |
| 6,318,680 B1 | 11/2001 | Benedict et al. | |
| 6,335,486 B1 * | 1/2002 | Reiker | ............................. 174/51 |
| 6,347,714 B1 | 2/2002 | Fournier et al. | |

(Continued)

FOREIGN PATENT DOCUMENTS

EP 1280363 A2 1/2003

*Primary Examiner* — Monica Millner
(74) *Attorney, Agent, or Firm* — Christopher S. Clancy; Aimee E. McVady

(57) ABSTRACT

A bracket assembly for electronic equipment support structures having an elongated main body, a mounting tab extending from a first edge of the main body, and first and second mounting arms extending from a second edge of the main body, opposite the first edge. The mounting tab has an aperture formed therethrough. The first mounting arm is positioned adjacent a first end of the main body and extends generally perpendicular to the main body and the mounting tab and the second mounting arm is positioned adjacent a second end of the main body, opposite the first end, and also extends generally perpendicular to the main body and the mounting tab. The bracket assembly can be mounted to a vertically oriented member of an electronic equipment support structure by: mounting the bracket assembly to the vertically oriented member; positioning the rack mountable equipment adjacent and generally parallel to the vertically oriented member such that the equipment is in a generally vertical orientation; and connecting the rack mountable equipment to the bracket assembly between opposing mounting arms of the bracket assembly.

11 Claims, 14 Drawing Sheets

(56) References Cited

U.S. PATENT DOCUMENTS

| | | | |
|---|---|---|---|
| D463,253 S * | 9/2002 | Canty | D8/356 |
| 6,489,565 B1 | 12/2002 | Krietzman et al. | |
| 6,501,899 B1 | 12/2002 | Marrs et al. | |
| 6,605,782 B1 | 8/2003 | Krietzman et al. | |
| 7,087,840 B2 | 8/2006 | Herring et al. | |
| 7,119,282 B2 | 10/2006 | Krietzman et al. | |
| 2003/0096536 A1 | 5/2003 | Clark et al. | |
| 2005/0115737 A1 * | 6/2005 | Levesque et al. | 174/100 |
| 2006/0118321 A1 | 6/2006 | Herring et al. | |

* cited by examiner

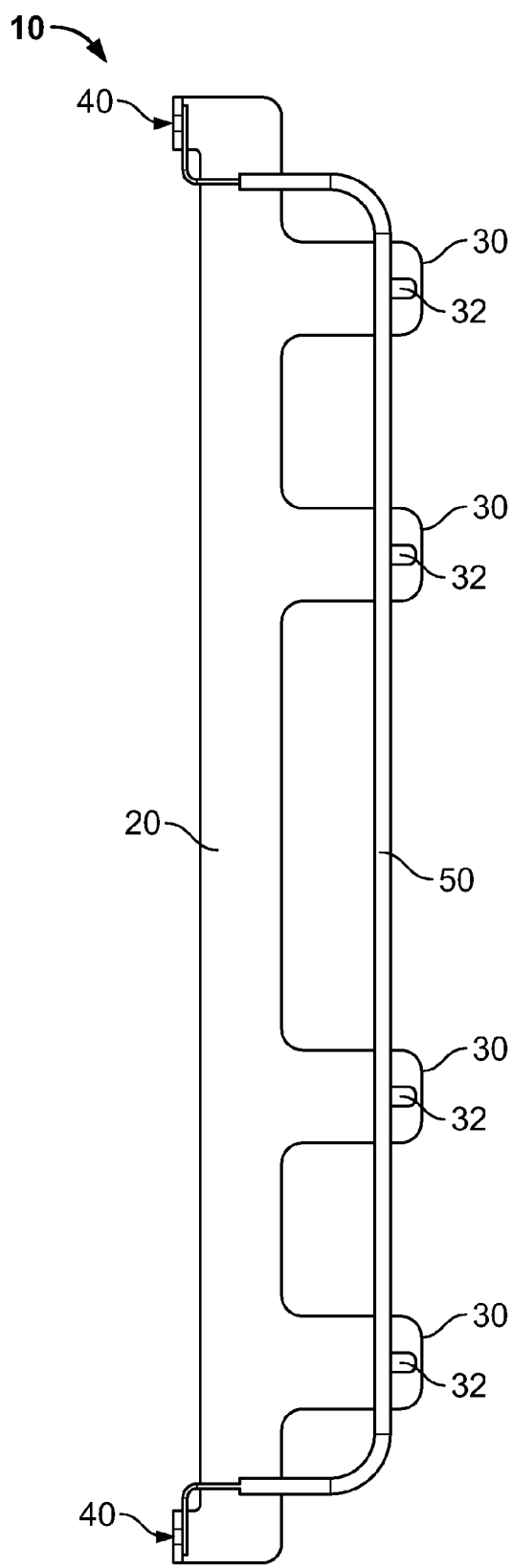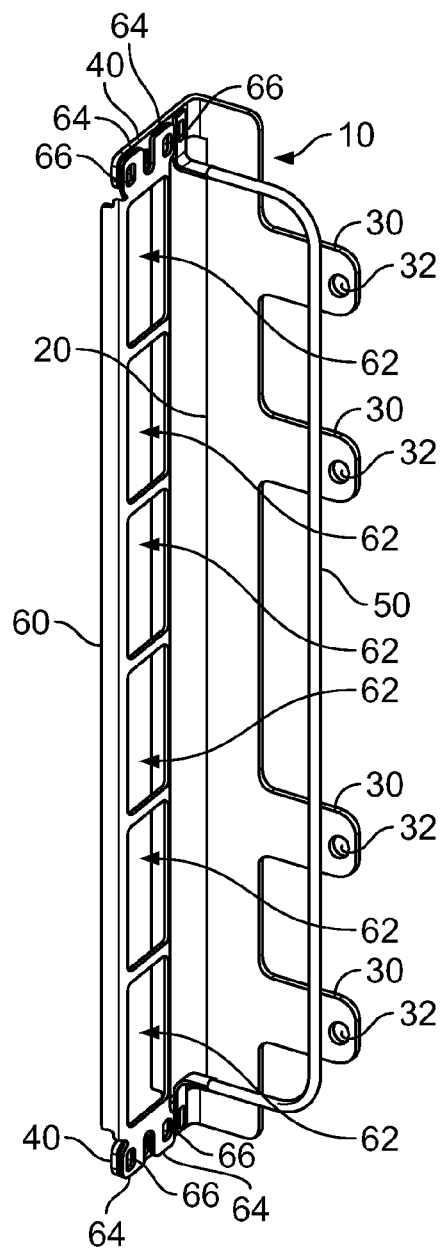
FIG. 3
FIG. 4

ACCESSORY BRACKET

CROSS-REFERENCE TO RELATED APPLICATIONS

This application claims priority to prior U.S. Provisional Patent Application No. 60/970,293, filed Sep. 6, 2007, and U.S. Provisional Patent Application No. 60/949,413, filed Jul. 12, 2007.

FIELD OF INVENTION

This invention relates to apparatus for mounting rack mountable equipment/accessories to electronic equipment support structures and, more particularly, to grounded brackets for vertically mounting the rack mountable equipment/accessories.

BACKGROUND

Typically, rack mountable equipment/accessories, such as patch panels, power distribution units (PDUs), switches, etc., are mounted within usable rack units (RUs) near the top of electronic equipment support structures, such as network cabinets, server cabinets, and 4 post racks. However, mounting the equipment/accessories in this manner has various drawbacks. For example, horizontally-mounted equipment/accessories occupy RUs that could be used for additional electronic equipment. In addition, by mounting the equipment/accessories near the top of the structure, patch cords that run between the equipment/accessories and other electronic equipment, such as servers, must be routed from the equipment/accessory horizontally to the side of the structure, vertically up the side of the structure, and horizontally over to the other equipment. To complete this routing can take patch cords from 5 to 9 feet in length to make the required connections. This makes equipment maintenance difficult when patch cords must be removed or replaced.

Therefore, there is a need for an accessory bracket that allows the mounting of standard rack mountable equipment/accessories, such that the rack mountable equipment/accessory does not occupy usable RUs and patch cord run length is reduced or minimized.

SUMMARY

In one example, a bracket assembly for electronic equipment support structures has an elongated main body, a mounting tab extending from a first edge of the main body, and first and second mounting arms extending from a second edge of the main body, opposite the first edge. The mounting tab has an aperture formed therethrough. The first mounting arm is positioned adjacent a first end of the main body and extends generally perpendicular to the main body and the mounting tabs and the second mounting arm is positioned adjacent a second end of the main body, opposite the first end, and also extends generally perpendicular to the main body and the mounting tabs.

In another example, an electronic equipment support structure assembly has an electronic equipment support structure and a bracket assembly. The electronic equipment support structure has a vertically oriented member having a plurality of holes and the bracket assembly is interconnected with the vertically oriented member. The bracket assembly has an elongated main body, a mounting tab extending from the main body, and first and second mounting arms extending from the main body. The elongated main body is positioned adjacent to and generally parallel to the vertically oriented member and the mounting tab has an aperture that is aligned with at least one of the holes formed in the vertically oriented member. The first mounting arm is positioned adjacent a first end of the main body and extends generally perpendicular to the main body and the mounting tabs and away from the vertically oriented member and the second mounting arm is positioned adjacent a second end of the main body, opposite the first end, and extends generally perpendicular to the main body and the mounting tabs and away from the vertically oriented member.

In another example, a method for mounting rack mountable equipment to an electronic equipment support structure has the steps of: mounting a bracket assembly to a vertically oriented member of the electronic equipment support structure; positioning the rack mountable equipment adjacent and generally parallel to the vertically oriented member such that the equipment is in a generally vertical orientation; and connecting the rack mountable equipment to the bracket assembly between opposing mounting arms of the bracket assembly.

BRIEF DESCRIPTION OF THE DRAWINGS

Certain examples of the present invention are illustrated by the accompanying figures. It should be understood that the figures are not necessarily to scale and that details that are not necessary for an understanding of the invention or that render other details difficult to perceive may be omitted. It should be understood, of course, that the invention is not necessarily limited to the particular examples illustrated herein.

FIG. 3 is a side view of the accessory bracket and strain relief bar of FIG. 1;

FIG. 4 is a front perspective view of the accessory bracket and strain relief bar of FIG. 1 with a patch panel frame;

DETAILED DESCRIPTION

Figure 1:
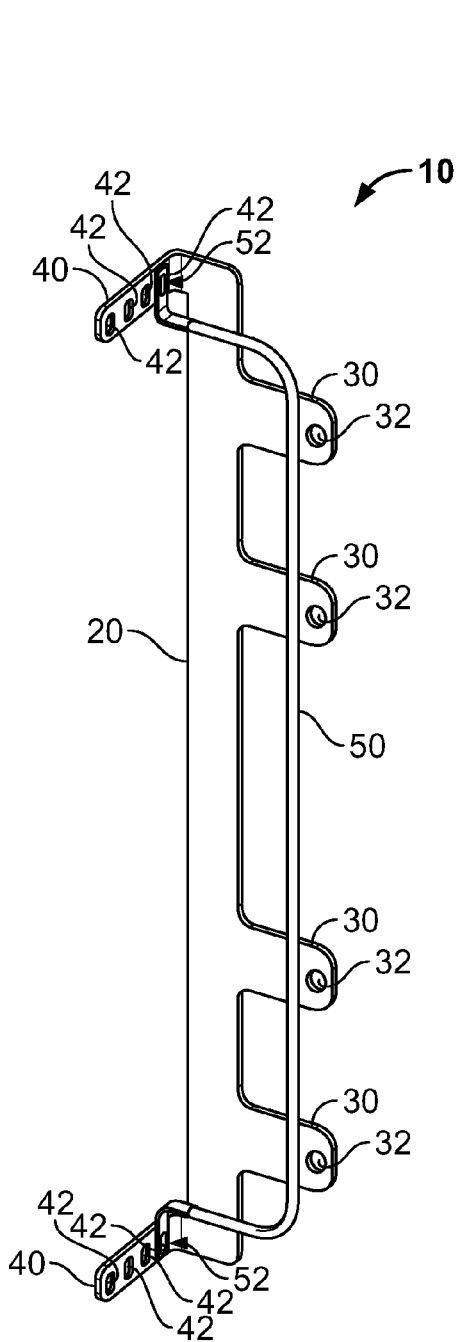
FIG. 1 is a front perspective view of one example of an accessory bracket with a strain relief bar.
Figure 2:
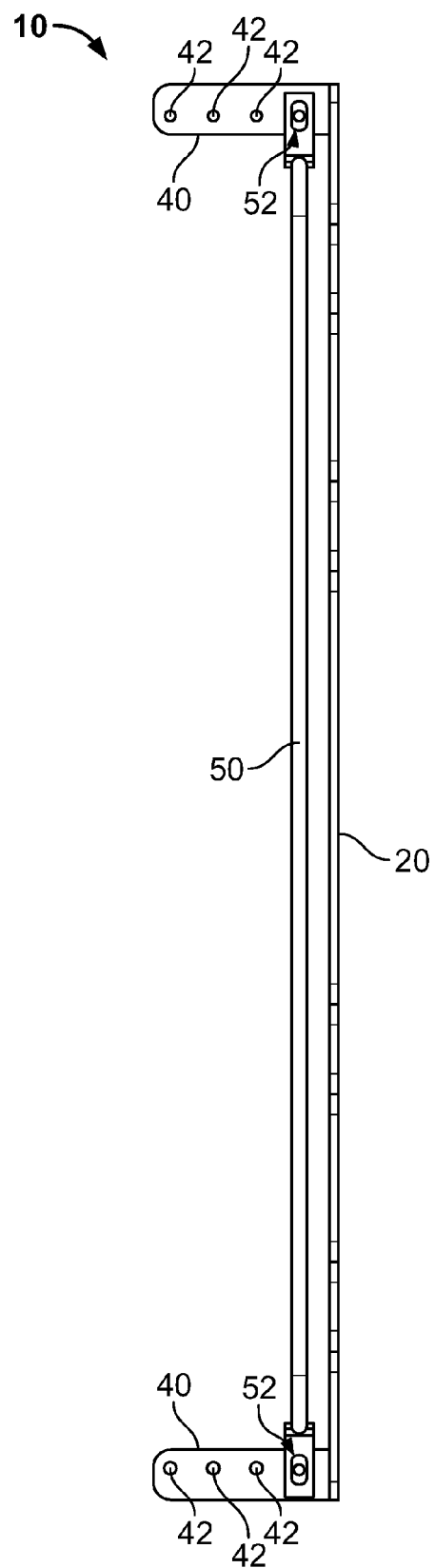
FIG. 2 is a front view of the accessory bracket and strain relief bar of FIG. 1.

Referring to FIGS. 1-3, one example of an accessory bracket 10 and strain relief bar 50 is shown. In the example shown, bracket 10 is configured to be mounted to the vertical frame rail or equipment rail of an electronic equipment support structure, such as a network cabinet, server cabinet, or 4 post rack, and can support various rack mountable equipment/accessories such as a standard 19-inch EIA patch panel frame, a standard 2-inch wide PDU, or a standard rack mounted switch, in a vertical orientation. The patch panel frame could include fiber adapter panels (FAPs), pre-terminated copper cartridges, six-port adapter fiber optic cassette modules, or other types of connectivity medium. In addition, as described in more detail below, bracket 10 could be extended such that multiple equipment/accessory units could be connected to bracket 10 in various combinations.

In the example shown, bracket 10 is generally L-shaped, is formed from an electrically conductive material, such as steel or aluminum, and generally has main body 20, mounting tabs 30 and mounting arms 40. Main body 20 provides the main support for bracket 10. In this example, bracket 10 is approximately 4 inches in width, 19⅛ inches in length, with 11/16 inch wide and 2¾ inch long protrusions bent at 90 degrees to the rest of bracket 10 to form mounting arms 40.

Mounting tabs 30 extend from one edge of main body 20 and provide a means for connecting bracket 10 to the electronic equipment support structure. In this example, each mounting tab 30 is approximately 1¼ inches in width and 2½ inches in length and has an elongated aperture 32 formed therethrough, which is configured to receive a mounting screw or bolt, as described in more detail below. Alternatively, the spaces between mounting tabs 30 could be eliminated. In other words, the spaces between each of the four mounting tabs 30 could be solid material. However, in this example, the material between the tabs has been removed in order to make bracket 10 lighter and make it possible to nest the blanks (punched-out shape before bending) within the raw material sheet size in order to yield more brackets from the stock material sheet size. Regardless, main body 20 should be at least ¾ inches wide in order to maintain the structural rigidity of bracket 10.

In this example, apertures 32 are elongated along the longitudinal axis of the corresponding mounting tab 30 to provide some flexibility in locating bracket 10 during installation. In addition, apertures 32 are also generally vertically aligned (as seen in FIG. 3) between each other such that apertures 32 will axially align with holes formed in the support structure. Alternatively, rather than having elongated apertures or slots 32, multiple apertures could be formed in each mounting tab 30 to provide multiple mounting options. In addition, in this example, four mounting tabs 30 are shown extending from the edge of main body 20. However, it will be understood that any number of mounting tabs could be used or one solid mounting tab with multiple apertures could be used. A minimum of two mounting slots or holes are required, but four slots help maintain an electrical ground path (continuity) from the equipment/accessory through bracket 10 to the support structure.

Mounting arms 40 extend from another edge of main body 20, opposite mounting tabs 30, are generally perpendicular to main body 20, and provide a means for supporting rack mountable electronic equipment/accessories, such as a patch panel frame 60 (see FIGS. 4 and 5), PDU, switch, etc., in a vertical orientation. In this example, each mounting arm 40 is approximately 11/16 inches in width and 2¾ inches in length and has multiple holes 42 formed therethrough. A 2¾ inch long mounting arm 40 will provide a 1½RU space (plus clearance) for one electronic equipment/accessory unit and one strain relief bar. A 3¾ inch long mounting arm 40 will provide a 2 RU space (plus clearance) that can be used to mount two electronic equipment/accessory units, one unit and up to two strain relief bars, or one unit and one open cable management bar. Holes 42 are aligned along the longitudinal axis of the corresponding mounting arm 40 and are spaced apart from each other such that holes 42 will align with holes 66 formed in a standard patch panel frame 60 (see FIGS. 4 and 5) or other rack mountable equipment/accessory. Alternatively, rather than having multiple holes 42, one or more elongated apertures could be formed in each mounting arm 40 to provide more flexibility in mounting various electronic equipment/accessories, such as patch panel frames, PDUs, switches, etc. Holes 42 can be tapped to eliminate the nuts and make assembling the equipment/accessories to bracket 10 easier and less complicated. If nuts are used, it may take two hands to hold the components together before tightening.

In addition. in the example shown, mounting arms 40 are configured to support one electronic component/accessory and a strain relief bar 50. However, as discussed above, mounting arms 40 could be extended, and additional holes 42 formed therein, such that multiple electronic components/accessories or combinations thereof could be supported by each bracket 10. Moreover, an extender bracket can also be used to make the mounting arm longer.

As shown in FIGS. 1-3, strain relief bar 50 can also be mounted to bracket 10. In this example, strain relief bar 50 is formed of an electrically conductive material, such as steel or aluminum, is generally U-shaped, and can be used for a variety of purposes, such as preventing cables from bending at an angle that could damage the cables, helping organize the cables, preventing the cables from getting pulled away from the connectors, and keeping the cables away from parts of the cabinet that can potentially move and pinch the cables. In this example, strain relief bar 50 is approximately 18.98 inches long and 2.81 inches deep, but could be made of varying shapes and sizes depending on the intended use. Elongated apertures 52 are formed in each end of strain relief bar 50 and are configured to be axially aligned with corresponding holes 42 in mounting arms 40 and to receive threaded members, which provides a means for mounting strain relief bar 50 to bracket 10.

To mount strain relief bar 50 to bracket 10, apertures 52 in strain relief bar 50 are aligned with holes 42 in mounting arms 40. A threaded member, such as a grounding (bond) screw or bolt, is inserted through apertures 52 and into holes 42 in mounting arms 40. If bolts are used, holes 42 will be configured to receive the threaded member therethrough and a nut will be threaded onto the bolt on the opposite side of mounting arm 40 from strain relief bar 50. If screws are used, holes 42 will be threaded and the screws will be threaded directly into the holes 42.

In the example described herein, strain relief bar 50 is grounded to bracket 10. Providing a ground path between strain relief bar 50 and bracket 10 can be accomplished in various well-known ways. For example, tri-lobular screws could be used that would form threads in holes 42 and provide a ground path between mounting arms 40 and the tri-lobular screws. To provide a ground path between the tri-lobular screws and strain relief bar 50, the screws could have serrated edges under the heads of the screws, a star washer could be used between the heads of the screws and strain relief bar 50, or areas in which the heads of the screws will contact strain relief bar 50 could be masked to exposed the bare metal (if strain relief bar 50 is not painted or coated, the heads of the screws will make direct metal to metal contact and masking is not required). Similarly, if nuts and bolts are used, the nuts and bolts could have serrated edges in the areas that will contact strain relief bar 50 and mounting arms 40, star washers could be used between the nuts and bolts and strain relief bar 50 and mounting arms 40, or areas in which the nuts and the heads of the bolts will contact strain relief bar 50 and mounting arms 40 could be masked to expose the bare metal (if strain relief bar 50 and/or mounting arms 40 are not painted or coated, the nuts and bolts will make direct metal to metal contact and masking is not required). A welded, soldered or terminated jumper cable with serrated screw or star washer could also be used.

Figure 5:
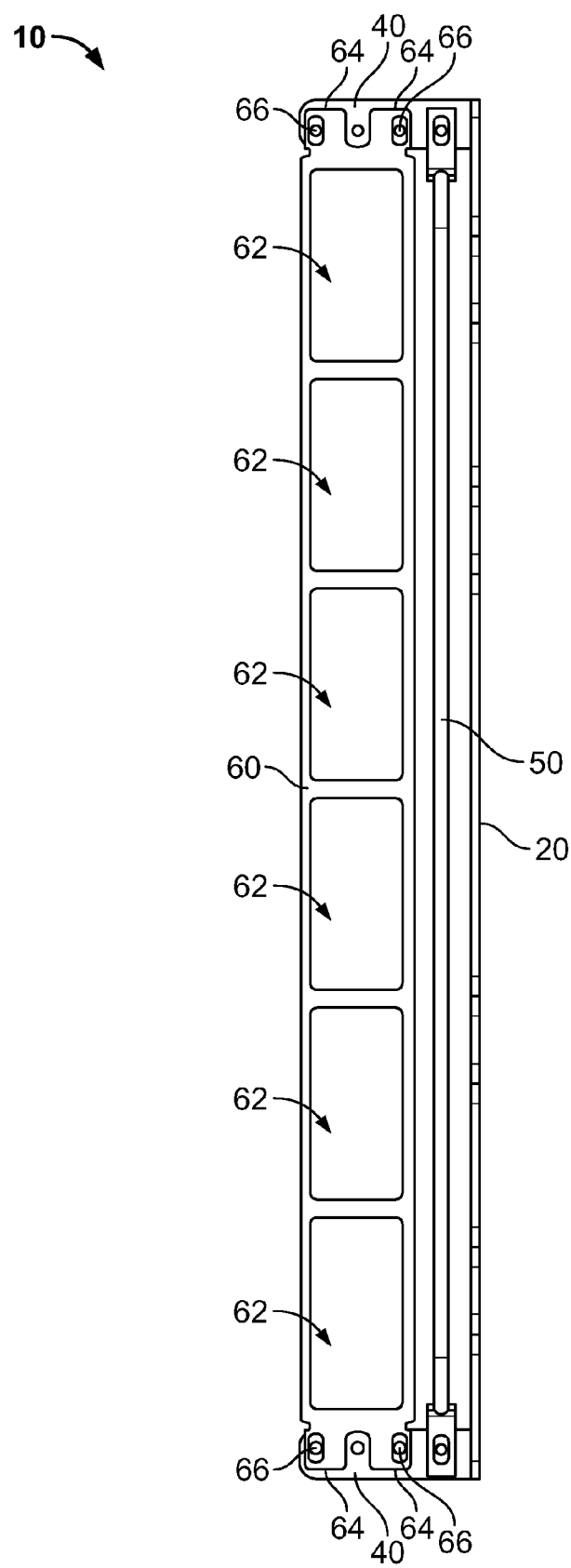
FIG. 5 is a front view of the accessory bracket, strain relief bar, and patch panel frame of FIG. 4.

Referring to FIGS. 4 and 5, exemplary bracket 10 is shown with a standard patch panel frame 60 mounted in a vertical orientation. A standard patch panel frame 60, such as a 19-inch EIA patch panel frame, is typically 1.72 to 1.73 inches in width and 19 inches in length. A series of openings 62 are formed in frame 60 and are configured to receive various types of components, such as FAPs, pre-terminated copper cartridges, six-port adapter fiber optic cassette modules, etc., as is well-known in the art. Mounting ears 64 extend from the ends of frame 60 and each mounting ear 64 has a hole 66 formed therethrough. As can best be seen in FIG. 5, holes 66 in mounting ears 64 are configured to axially align with holes 42 in mounting arms 40 and to receive bolts or screws therethrough to allow the mounting of frame 60 to bracket 10.

By using bracket 10 to vertically orient electronic components/accessories on the side of a support structure. RUs that were occupied by electronic components/accessories are now open and can be used for additional electronic equipment. In addition, routing patch cables to the vertically-oriented electronic components/accessories is more efficient and cost effective because shorter cable lengths can be used. For example, by using bracket 10 to mount electronic components/accessories on the side of the support structure, next to other electronic equipment, patch cords as short as 1½ to 2 feet can be used. The use of shorter patch cords also makes equipment maintenance easier when patch cords must be removed or replaced.

To mount frame 60 to bracket 10, holes 66 in frame 60 are aligned with holes 42 in mounting arms 40. A threaded member, such as a screw or bolt, is inserted through holes 66 in frame 60 and into holes 42 in mounting arms 40. If bolts are used, holes 42 will be configured to receive the threaded member therethrough and a nut will be threaded onto the bolt on the opposite side of mounting arm 40 from frame 60. If screws are used, holes 42 will be threaded and the screws will be threaded directly into the holes 42.

In the example described herein, frame 60 is grounded to bracket 10. Providing a ground path between frame 60 and bracket 10 can be accomplished in various well-known ways. For example, tri-lobular screws could be used that would form threads in holes 42 and provide a ground path between mounting arms 40 and the tri-lobular screws. To provide a ground path between the tri-lobular screws and frame 60, the screws could have serrated edges under the heads of the screws, a star washer could be used between the heads of the screws and frame 60, or areas in which the heads of the screws will contact frame 60 could be masked to expose the bare metal (if frame 60 is not painted or coated, the heads of the screws will make direct metal to metal contact and masking is not required). Similarly, if nuts and bolts are used, the nuts and bolts could have serrated edges in the areas that will contact frame 60 and mounting arms 40, star washers could be used between the nuts and bolts and frame 60 and mounting arms 40, or areas in which the nuts and the heads of the bolts will contact frame 60 and mounting arms 40 could be masked to expose the bare metal (if frame 60 and/or mounting arm 40 are not painted or coated, the nuts and bolts will make direct metal to metal contact and masking is not required).

Figure 6:
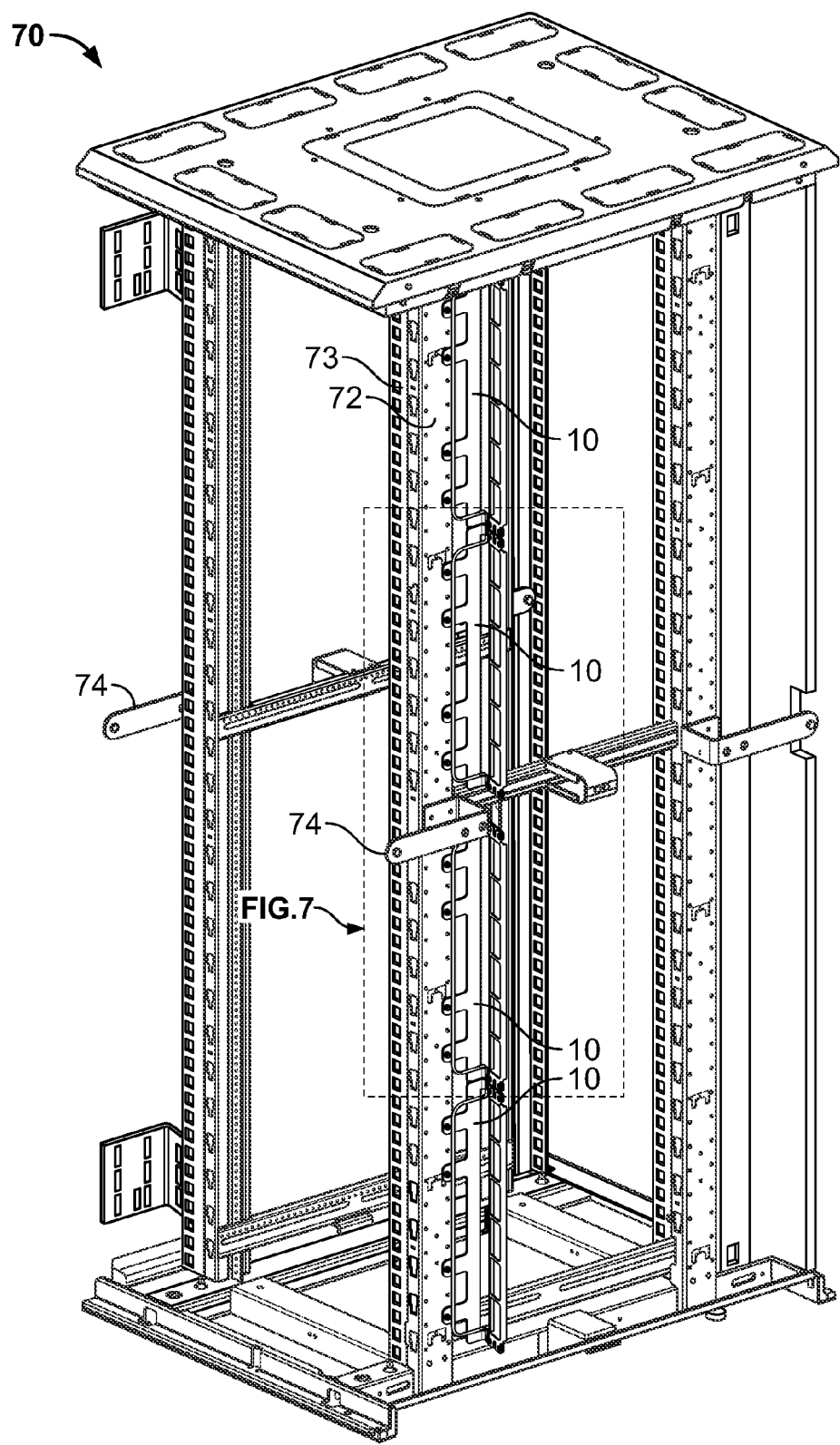
FIG. 6 is a side perspective view of a cabinet with multiple accessory brackets mounted therein.
Figure 7:
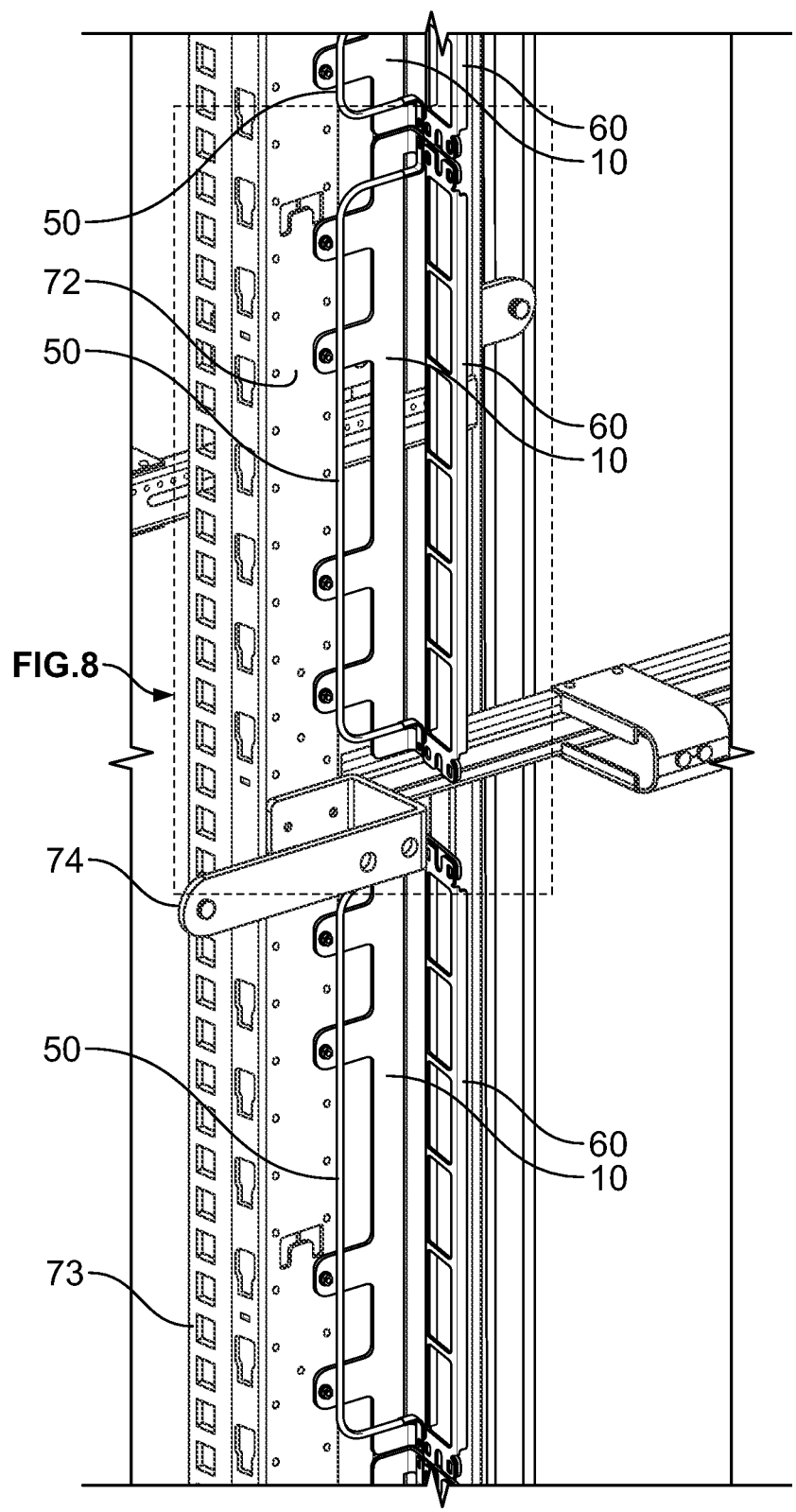
FIG. 7 is an enlarged partial view of FIG. 6.
Figure 8:
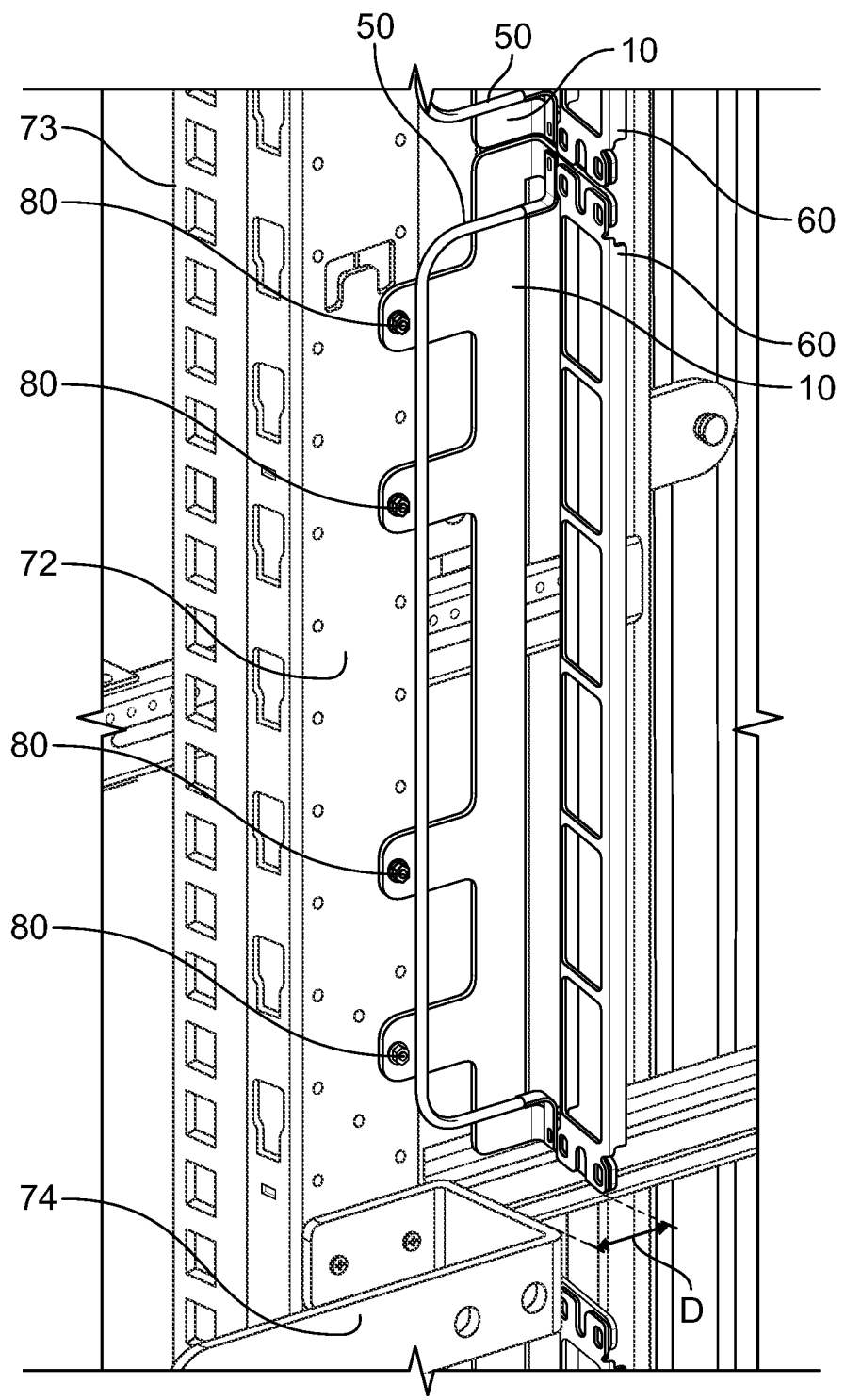
FIG. 8 is an enlarged partial viewer of FIG. 7
Figure 9:
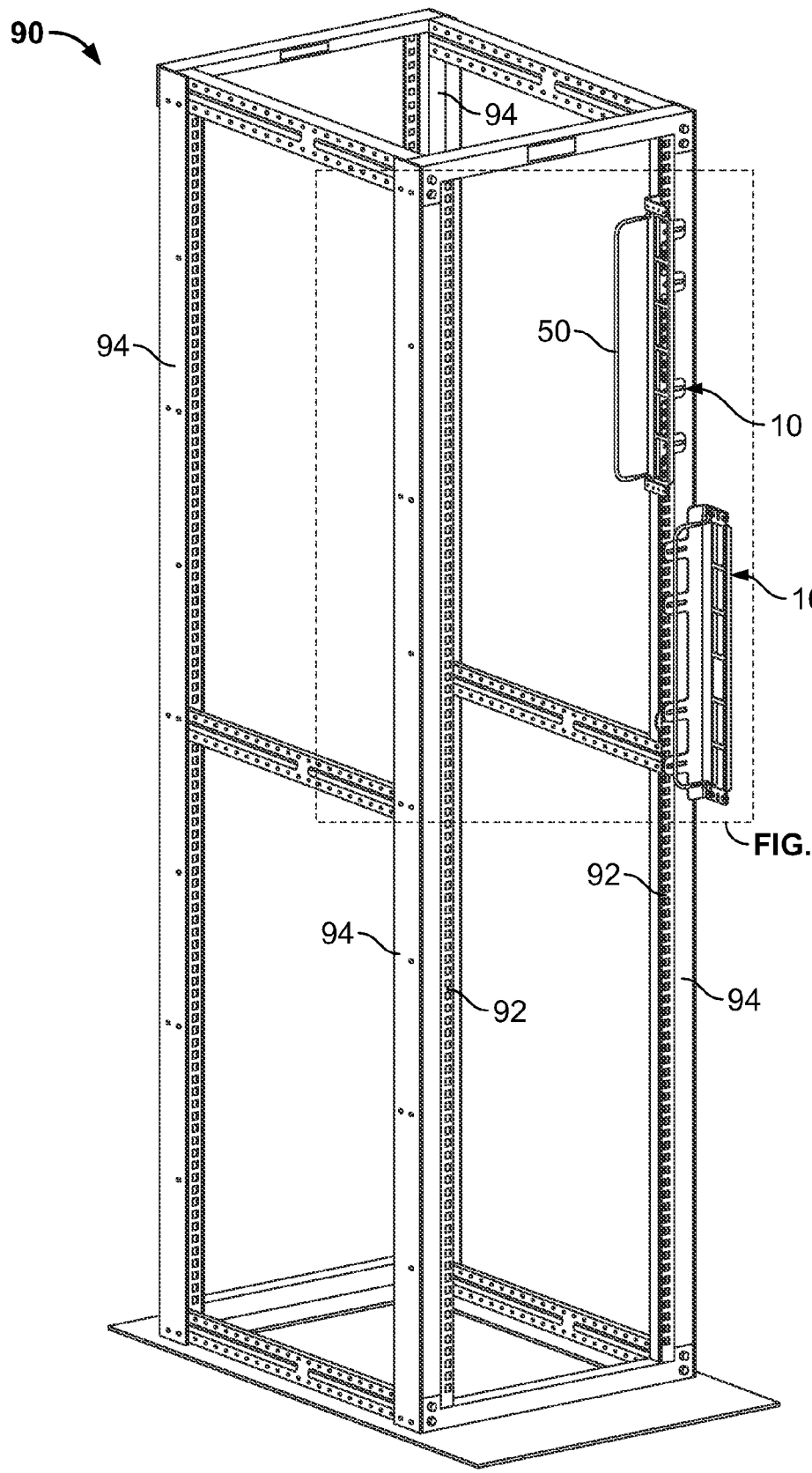
FIG. 9 is a side perspective view of a 4 post rack with multiple accessory brackets mounted therein.
Figure 10:
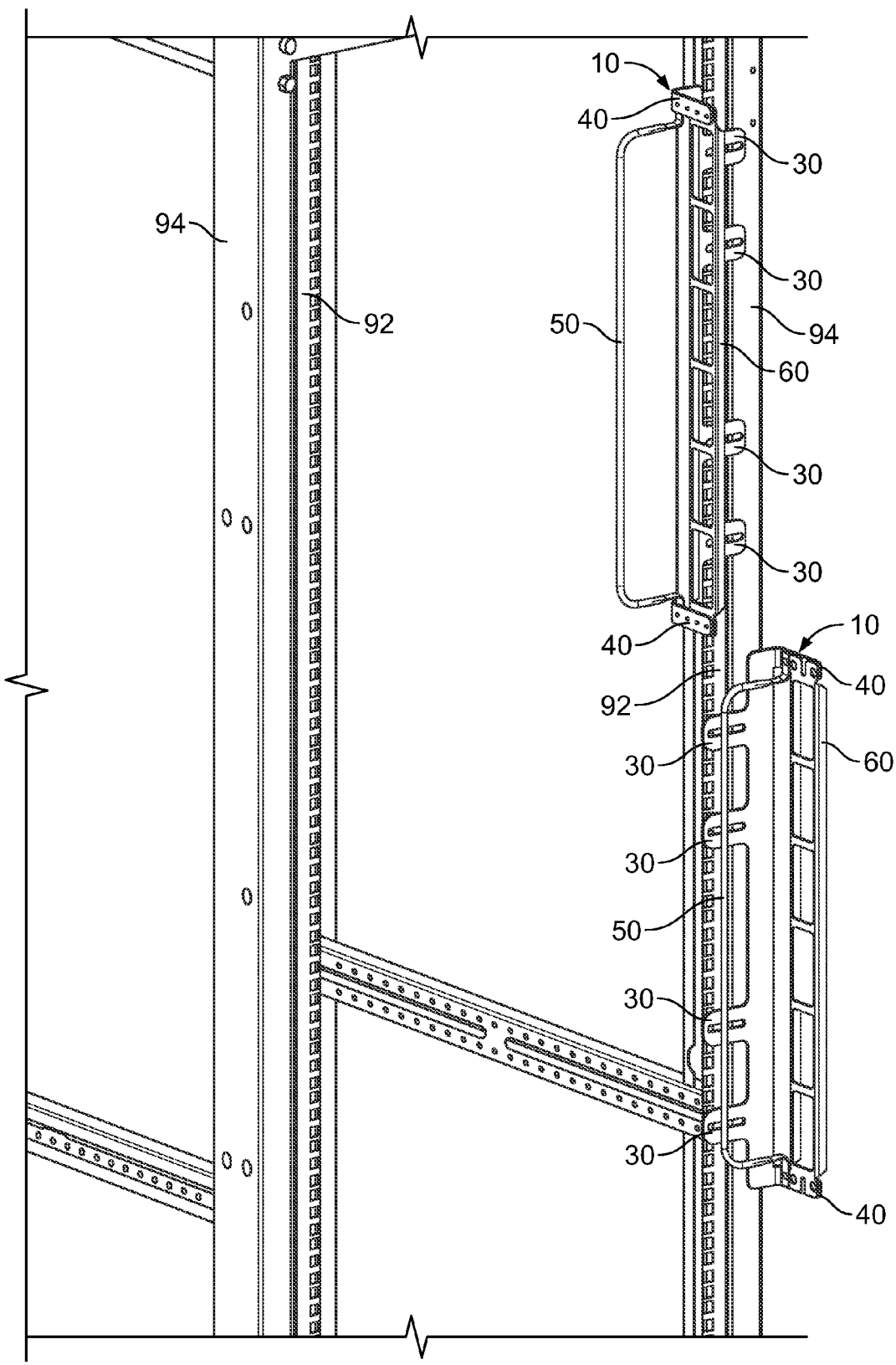
FIG. 10 is an enlarged partial view of FIG. 9.
Figure 11:
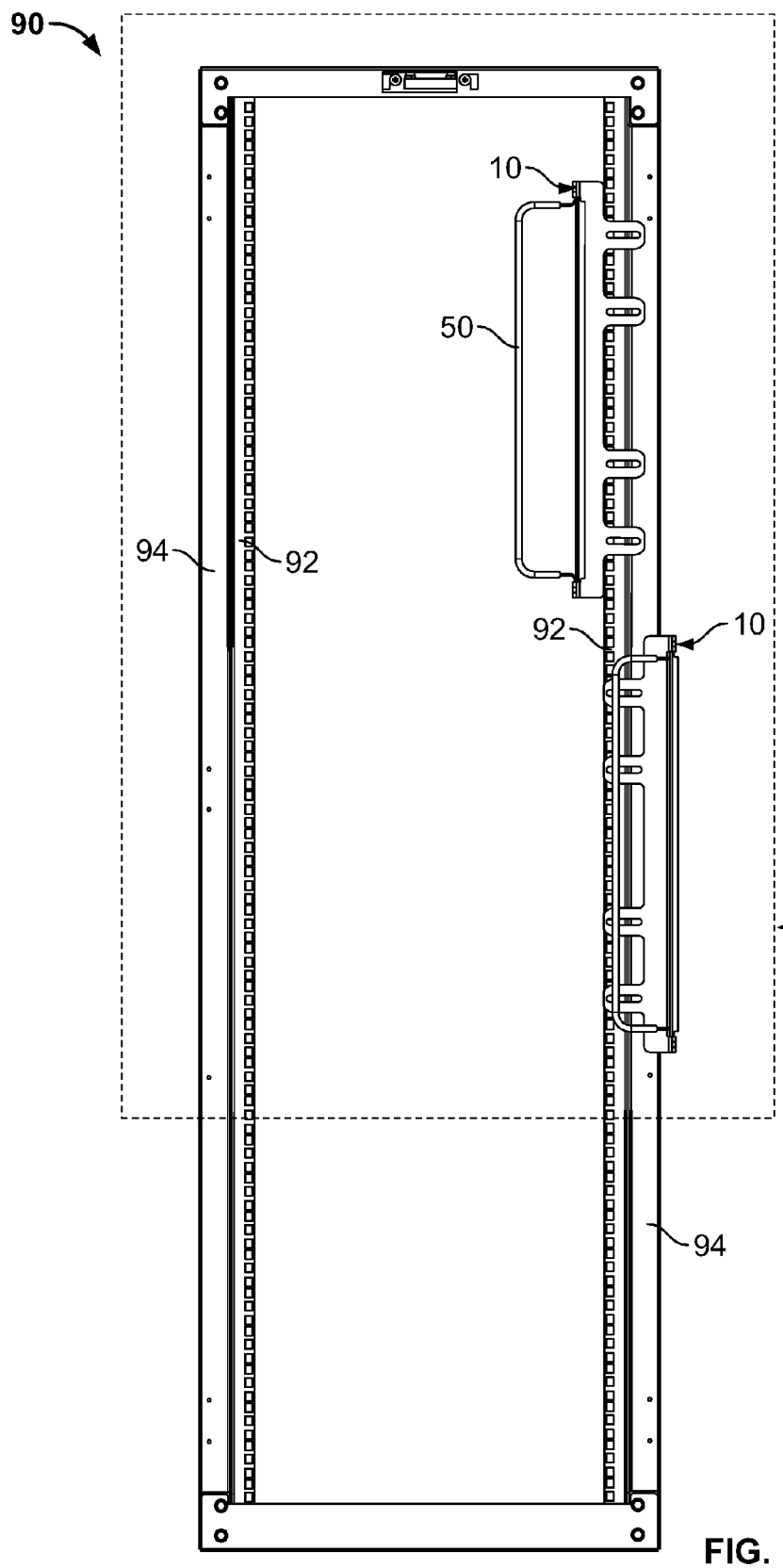
FIG. 11 is a front view of the 4 post rack and accessory brackets of FIG. 9.

Referring now to FIGS. 6-8, multiple exemplary accessory brackets 10 are shown mounted to the vertical frame rail 72 of an electronic equipment cabinet 70 (in FIGS. 6-8 the front door, rear door, and side panels of cabinet 70 are not shown to expose the frame of the cabinet). As shown in FIGS. 6-8 and described herein, cabinet 70 is a network cabinet, such as that shown and described in co-pending U.S. patent application Ser. Nos. 11/467,956; 11/538,884; 11/559,708; 11/623,358; 11/623,839; and 11/683,052, which are incorporated herein by reference. However, it will be understood that bracket 10 can be used with any type of cabinet or other electronic equipment support structure that is adapted to carry electronic equipment, such as servers. Furthermore, rather than mounting bracket 10 to vertical frame rail 72, bracket 10 could also be mounted to equipment rail 73, as discussed below, or any other portion of the cabinet support structure desired.

As can best be seen in FIG. 8, to mount bracket 10 to vertical frame rail 72, apertures 32 in mounting tabs 30 are aligned with holes formed in vertical frame rail 72. Mounting screws 80 are then inserted through holes 32 in mounting tabs 30 and are threaded into the holes in vertical frame rail 72. In the example shown, bracket 10 is configured to mount patch panel frame 60 at a maximum distance D of 5⅝ inches from the rear face of vertical frame rail 72, with patch panel frame 72 facing the front of cabinet 70. This offset provides a safe zone to allow clearance between the side panel latches and any mounted equipment or cables attached to the mounted patch panel. In addition, the first tapped hole in mounting arm 40 is located approximately 0.578 inches from main body 20 in order to center patch panel frame 60 and strain relief bar 50 in between vertical frame rail 72 and side panel structural supports 74.

In addition, in the example shown, bracket 10 is grounded to vertical frame rail 72. Providing a ground path between bracket 10 and vertical frame rail 72 can be accomplished in various well-known ways. For example, mounting screws 80 could be tri-lobular screws that would form threads in the holes in vertical frame rail 72 and provide a ground path between vertical frame rail 72 and mounting screws 80. To provide a ground path between mounting screws 80 and bracket 10, screws 80 could have serrated edges under the heads of screws 80, a star washer could be used between the heads of screws 80 and bracket 10, or areas in which the heads of screws 80 will contact bracket 10 could be masked to expose the bare metal (if bracket 10 is not painted or coated, the heads of the screws will make direct metal to metal contact and masking is not required). A welded, soldered or terminated jumper cable with serrated screw or star washer could also be used.

Referring now to FIGS. 9-16, multiple exemplary accessory brackets 10 are shown mounted to the equipment rail 92 of a 4 post rack 90. Alternatively, rather than mounting bracket 10 to equipment rail 92, bracket 10 could also be mounted to vertical frame rail 94, as discussed above, or any other portion of the 4 post rack desired.

Figure 12:
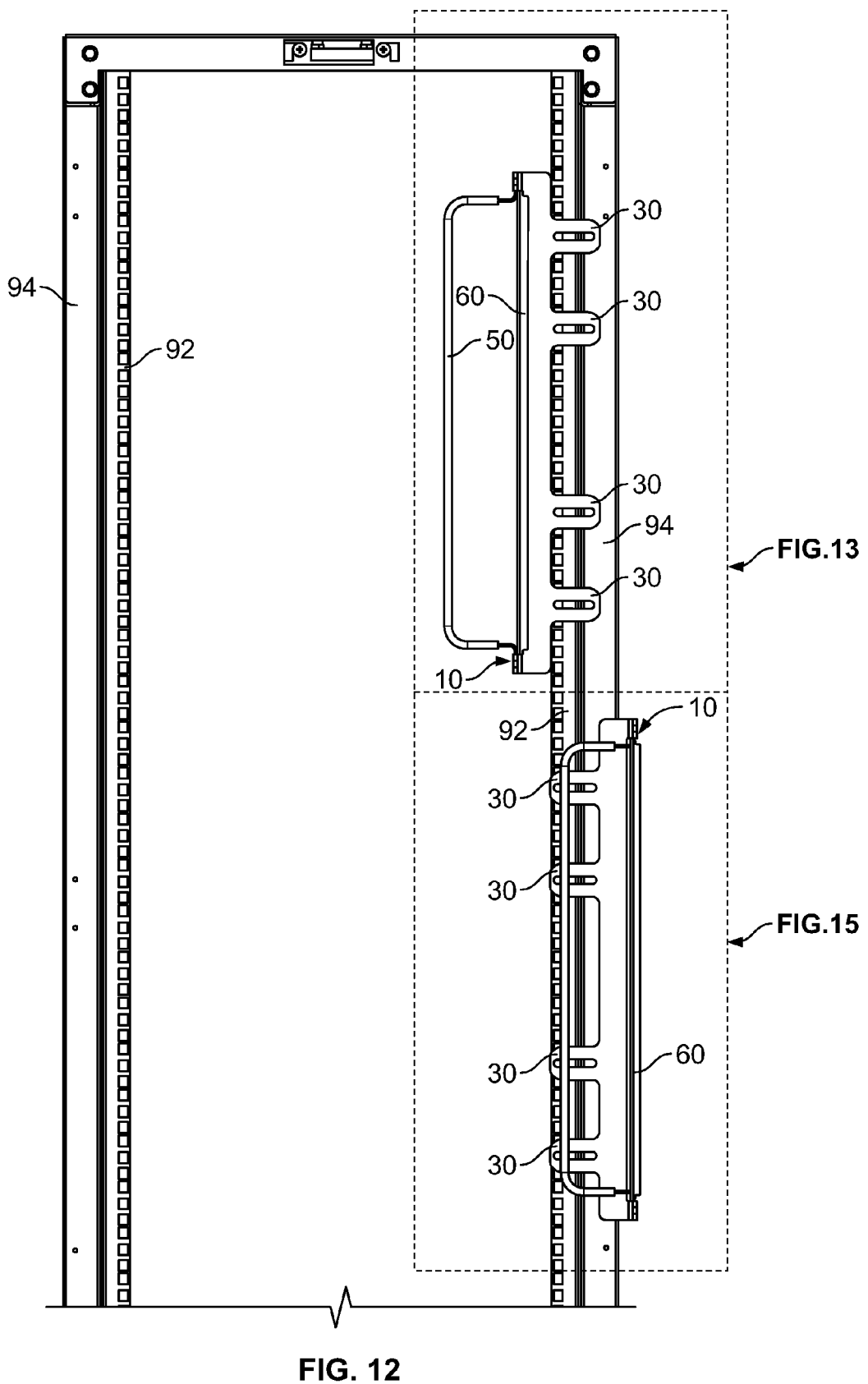
FIG. 12 is an enlarged partial view of FIG. 11.
Figure 13:
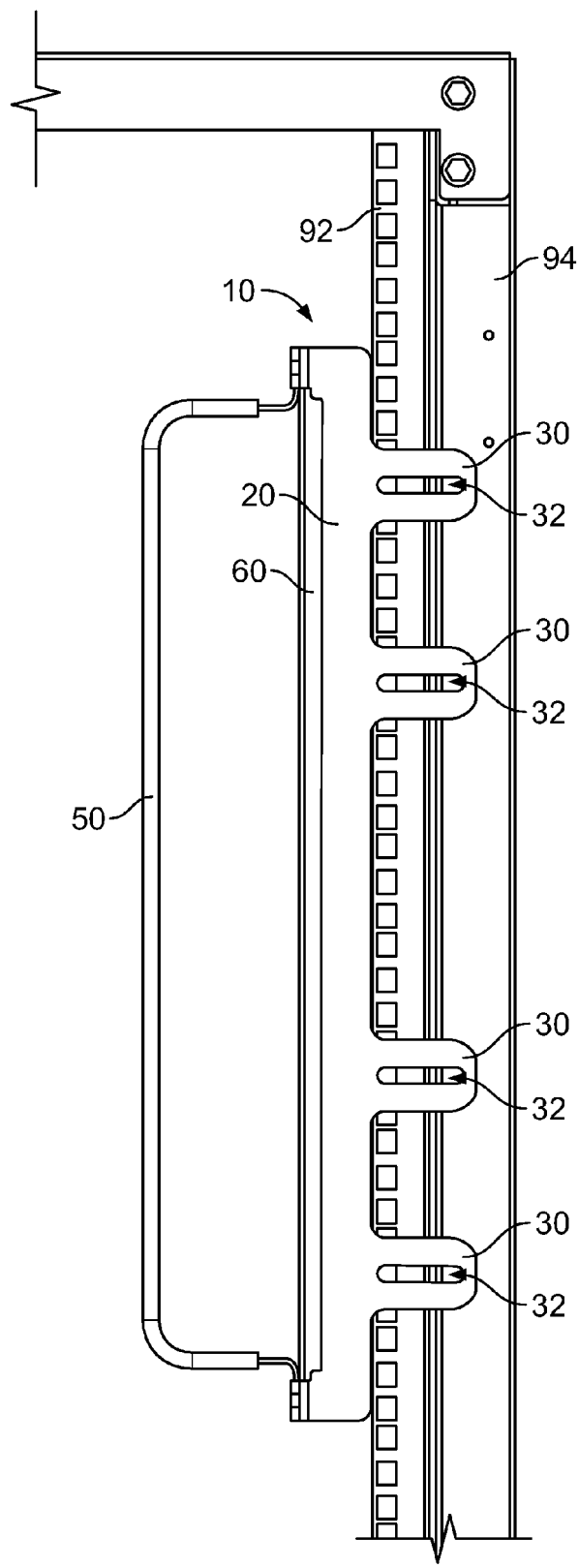
FIG. 13 is an enlarged partial view of FIG. 12 showing one of the accessory brackets.
Figure 14:
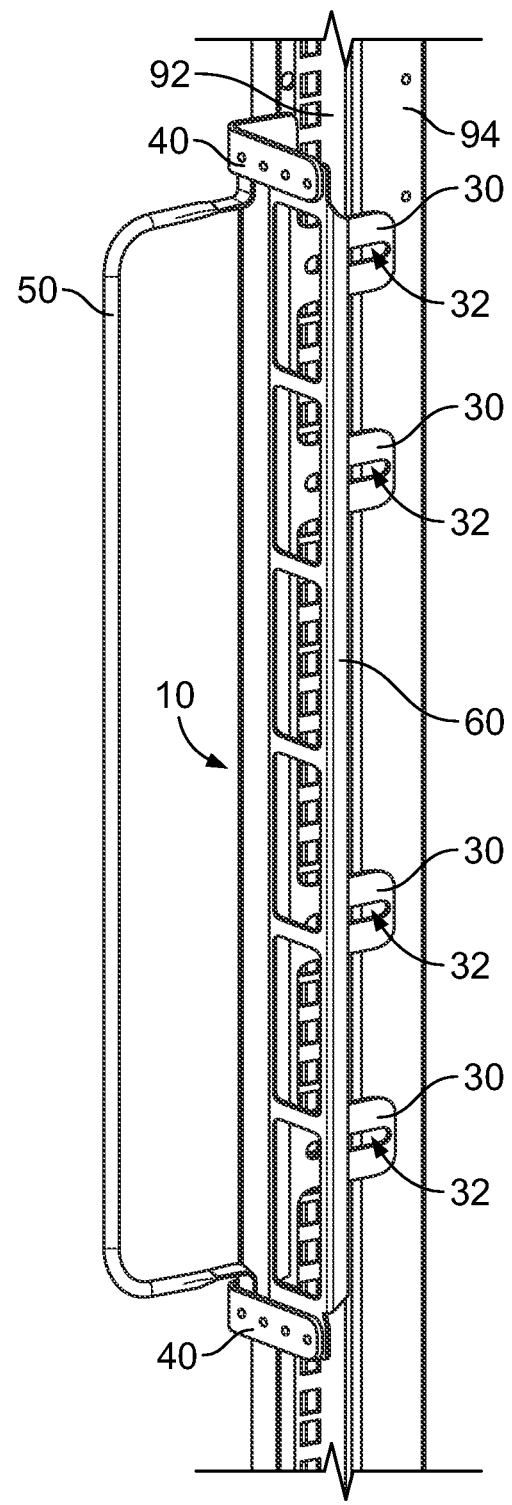
FIG. 14 is a partial side perspective view of FIG. 13.
Figure 15:
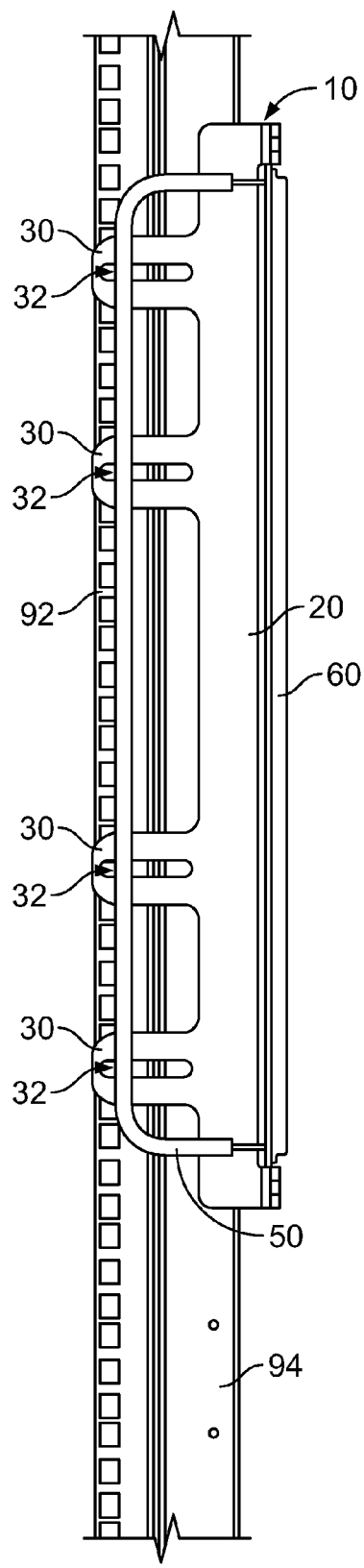
FIG. 15 is an enlarged partial view of FIG. 12 showing the other accessory bracket.
Figure 16:
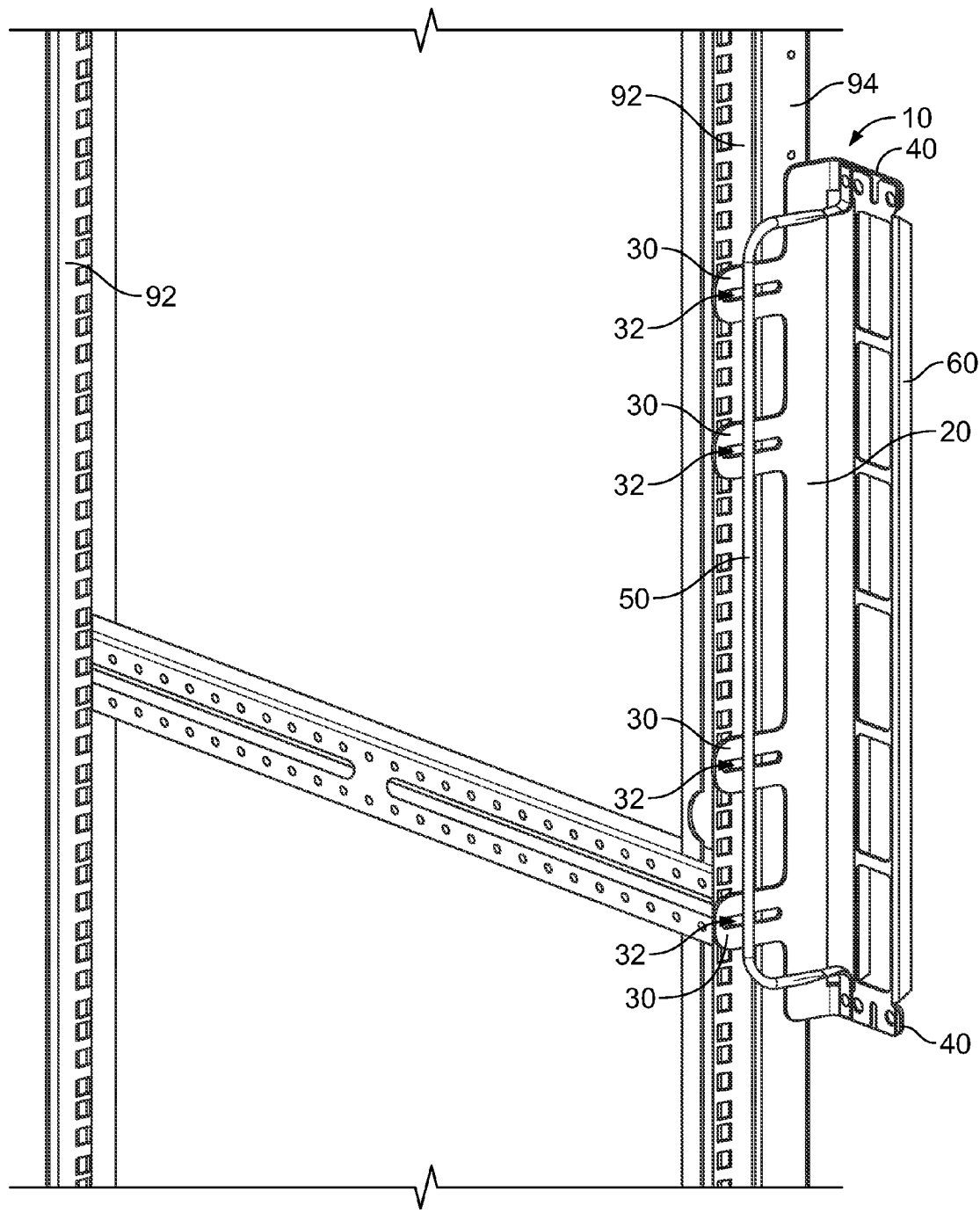
FIG. 16 is a partial side perspective view of FIG. 15.

As can best be seen in FIGS. 12, 13, and 15, to mount bracket 10 to equipment rail 92, apertures 32 in mounting tabs 30 are aligned with holes formed in equipment rail 92. Bolts (not shown) are then inserted through holes 32 in mounting tabs 30 and the holes in equipment rail 92 and a nut is threaded onto the bolt on the opposite side of equipment rail 92 from bracket 10.

In addition, in the example shown, bracket 10 is grounded to equipment rail 92. Providing a ground path between bracket 10 and equipment rail 92 can be accomplished in various well-known ways. For example, the nuts and bolts could have serrated edges in the areas that will contact bracket 10 and equipment rail 92, star washers could be used between the nuts and bolts and bracket 10 and equipment rail 92, or areas in which the nuts and the heads of the bolts will contact bracket 10 and equipment rail 92 could be masked to expose the bare metal (if bracket 10 and/or equipment rail 92 are not painted or coated, the nuts and bolts will make direct metal to metal contact and masking is not required).

The invention claimed is:

1. A bracket assembly for electronic equipment support structures, comprising:
   an elongated main body;
   a mounting tab extending from a first edge of the main body, the mounting tab having an aperture formed therethrough;
   a first mounting arm extending from a second edge of the main body, opposite the first edge, the first mounting arm being positioned adjacent a first end of the main body and extending perpendicular to the main body and the mounting tab; and
   a second mounting arm extending from the second edge of the main body, the second mounting arm being positioned adjacent a second end of the main body, opposite the first end, and extending perpendicular to the main body and the mounting tab;
   wherein the first mounting arm and the second mounting arm receive rack mountable equipment therebetween and position the rack mountable equipment such that a front of the rack mountable equipment is perpendicular to the main body and the mounting tab.

2. The bracket assembly of claim 1, wherein the first mounting arm and the second mounting arm each have a plurality of mounting holes formed therein.

3. The bracket assembly of claim 1, wherein the first mounting arm and the second mounting arm each have an elongated mounting slot formed therein.

4. The bracket assembly of claim 1, wherein the aperture formed in the mounting tab comprises an elongated slot.

5. The bracket assembly of claim 1, further comprising a strain relief bar mounted between the mounting arms.

6. The bracket assembly of claim 5, wherein the strain relief bar is electrically grounded to at least one of the mounting arms.

7. The bracket assembly of claim 1, further comprising rack mountable equipment positioned between and interconnected with the mounting arms.

8. The bracket assembly of claim 7, wherein the rack mountable equipment is one of a patch panel frame, a power distribution unit, and a switch.

9. The bracket assembly of claim 7, wherein the rack mountable equipment is electrically grounded to at least one of the mounting arms.

10. The bracket assembly of claim 1, wherein the mounting tab is configured to mount the bracket assembly to the electronic equipment support structure such that the elongated main body is vertical and the first mounting arm and the second mounting arm extend horizontally.

11. The bracket assembly of claim 10, wherein the mounting tab is configured to mount the bracket assembly to one of a vertical frame rail of the electronic equipment support structure and an equipment rail of the electronic equipment support structure.

* * * * *